United States Patent
Parker et al.

(10) Patent No.: US 12,199,404 B2
(45) Date of Patent: Jan. 14, 2025

(54) SEMICONDUCTOR OPTICAL AMPLIFIER LIGHT COMBINER

(71) Applicant: OpenLight Photonics, Inc., Goleta, CA (US)

(72) Inventors: John Parker, Goleta, CA (US); Tom Mader, Goleta, CA (US); Steven B. Alleston, Los Gatos, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 232 days.

(21) Appl. No.: 17/902,334

(22) Filed: Sep. 2, 2022

(65) Prior Publication Data
US 2024/0079849 A1 Mar. 7, 2024

(51) Int. Cl.
*G02B 6/12* (2006.01)
*H01S 5/026* (2006.01)
*H01S 5/50* (2006.01)

(52) U.S. Cl.
CPC ........ *H01S 5/0265* (2013.01); *G02B 6/12004* (2013.01); *H01S 5/50* (2013.01); *G02B 2006/12061* (2013.01); *G02B 2006/12121* (2013.01); *G02B 2006/12142* (2013.01); *G02B 2006/12147* (2013.01); *G02B 2006/1215* (2013.01)

(58) Field of Classification Search
CPC ........ H01S 5/0265; H01S 5/50; H01S 5/0683; H01S 5/0014; H01S 5/0262; H01S 5/06246; H01S 5/5018; G02B 6/12004; G02B 2006/12061; G02B 2006/12121; G02B 2006/12142; G02B 2006/12147; G02B 2006/1215; G02B 6/12; G02B 2006/12138
See application file for complete search history.

(56) References Cited

U.S. PATENT DOCUMENTS 10,754,091 B1 * 8/2020 Nagarajan ............... G02B 6/126
2016/0178861 A1 6/2016 Osenbach et al.

FOREIGN PATENT DOCUMENTS

| CN | 117647909 A | 3/2024 |
| TW | 201432346 A | 8/2014 |
| TW | 202414038 A | 4/2024 |

OTHER PUBLICATIONS

"InP high power monolithically integrated widely tunable laser and SOA array for hybrid integration", Optics Express vol. 29, No. 3, (Feb. 1, 2021), 13 pgs.
McKinzie, Keith A, "Supplementary Material to: InP High Power Monolithically Integrated Widely Tunable Laser and SOA Array for Hybrid Integration", Optical Society of America, (2020), 9 pgs.
"Taiwanese Application Serial No. 112133255, Office Action mailed Jul. 19, 2024", With English Machine Translation, 18 pgs.

* cited by examiner

*Primary Examiner* — John Bedtelyon
(74) *Attorney, Agent, or Firm* — Schwegman Lundberg & Woessner, P.A.

(57) ABSTRACT

Disclosed is a coherent optical combining photonic integrated circuit that can detect and align light amplified by a scalable quantity of semiconductor optical amplifiers (SOAs). The light can be split into beams and amplified by individual SOAs in a PIC and combined via couplers in the PIC. The combined light can be measured using a photodetector and the light beams can be adjusted based the photodetector measurement to coherently combine the light to achieve high optical power from the photonic integrated circuit.

20 Claims, 6 Drawing Sheets

SEMICONDUCTOR OPTICAL AMPLIFIER LIGHT COMBINER

TECHNICAL FIELD

The present disclosure generally relates to optical devices and more particularly to optical combiners.

BACKGROUND

Photonic integrated circuits can be implemented to achieve very low loss, lightweight, compact optical devices. While photonic integrated circuits have remarkable properties, it is difficult to implement photonic integrated circuit designs for high power optical applications. One example application includes LIDAR in which higher optical powers are increasingly correlated with greater ranging and detection information, which allows a given LIDAR system to detect objects sooner, which can increase safety.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Figure 1:
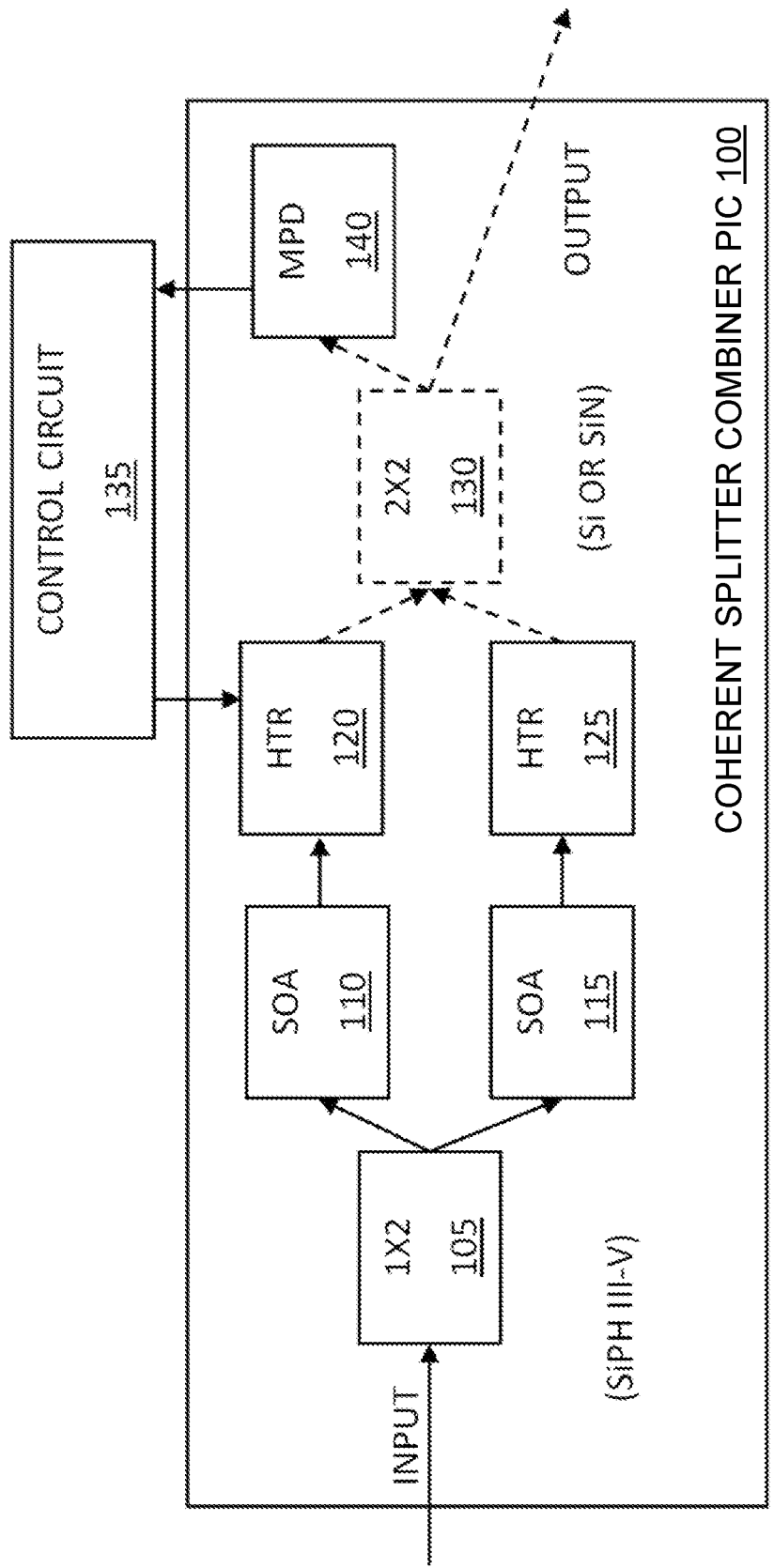
FIG. 1 shows an example low-loss single-die coherent splitter combiner photonic integrated circuit, in accordance with some example embodiments.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

As discussed, some optical devices achieve higher performance at higher powers to yield high optical output light. For instance, in a LIDAR system, increasing power enables increasing operating range and detection, which can enable a LIDAR-based vehicle to detect danger sooner. One issue with optical applications that are more performant at higher powers (e.g., LIDAR) is that it can be difficult to integrate high-power components in a photonic integrated circuit without limiting the functionality of the design. As an example, semiconductor optical amplifiers (SOAs) can be used to amplify light in a photonic integrated circuit (PIC). Often SOAs exhibit gain saturation effects. When SOA current is low, the SOA is in an absorption configuration in which the resulting SOA output power is an increasing function of the input power (e.g., absorption saturation). However, when the drive current is above a given threshold (e.g., transparency current of the SOA), the resulting output power becomes a decreasing function of the input power (gain saturation). Thus merely increasing drive current or increasing the amplifier length does not overcome the gain saturation issues encountered to achieve high-power PIC performance.

To address the foregoing issues, in some example embodiments a semiconductor optical amplifier coherent combiner implements multiple parallel semiconductor optical amplifiers to amplify the optical light power. By implementing a parallel combiner architecture, the power handled by a single semiconductor optical amplifier is reduced. In some example embodiments, the SOA outputs are coupled into one or more silicon waveguides in which the outputs are phase matched, and incoherently combined in silicon and silicon nitride waveguides.

In some example embodiments, the light is split into multiple parallel SOAs for amplification and then coupled back into a silicon waveguide for phase control. In some example embodiments, the light is coupled back into one or more silicon or silicon nitride components for beam combining. In some example embodiments, a photodiode is disposed after a beam combiner that combines the light beams, thereby enabling closed-loop control of the light phases. In some example embodiments, all high power PIC design optical components are integrated in a single optical die, which achieves a low loss design that is practical to build and use (e.g., as opposed to non-PIC solutions).

In some example embodiments, an issue for high power PIC embodiments is a loss due to two-photon absorption effects. For example, a design having additional SOAs in parallel may have an overall optical performance limited to that of a single SOA's limit. To address the foregoing, and in accordance with some example embodiments, one or more SOA output waveguides are coupled to one or more silicon nitride waveguides before combining to reduce two-photon absorption effects and support higher power in a single waveguide. In this way, the components formed from silicon nitride can support significantly higher optical power than the silicon components (e.g., 10-20× higher than silicon embodiments limited by two-photon absorption).

In some example embodiments, a tap port is transitioned back to a silicon waveguide before reaching a hybrid silicon photonic monitor photodiode (MPD) for monitoring and control. In this way, the light coherence is implemented via an MPD-based approach that can scale to coherently combine additional pairs of SOAs for efficient and practical high-power PIC devices.

FIG. 1 shows an example low-loss single-die coherent splitter combiner PIC 100 in which an integrated heater is controlled to minimize MPD current for coherent combining and high-power optical signaling, in accordance with some example embodiments. As illustrated, an input optical beam is coupled to a 1×2 coupler 105, and the beam is split into a first beam that is coupled to a semiconductor optical amplifier 110 and a second beam that is directed to a semiconductor optical amplifier 115 (e.g., via a passive silicon or III-V material waveguides). The heater 120 heats the material guiding the first light beam to perform phase shifting.

In some example embodiments, a second heater 125 heats the material guiding the second light beam for phase shifting. In some example embodiments, only one of the heaters 120, 125 is implemented (e.g., whichever heater is more power efficient) thereby lowering overall power consumption. In some example embodiments, the first beam and the second beam are combined in a 2×2 optical coupler 130, which directs a first output port to a monitor photodiode (MPD) 140 and a second output port to an output waveguide.

As shown in FIG. 1, different components may be formed from silicon or silicon nitride. In the illustrated embodiment of FIG. 1, the components lined with dashes are formed using silicon nitride. In some example embodiments, the control circuit 135 receives a photocurrent from the monitor photodiode 140 to control heating of one or more of the heaters (e.g., the heater 120 and/or the heater 125) to cause phase shifting such that a minimum amount of current is detected at the monitor photodiode 140 (e.g., phase shifting to cause destructive interference when combined). The minimization of the current detected at the photodiode coupled to a first output port of the 2×2 coupler 130 thereby indicates that a maximum amount of optical power is directed toward the second output port of the 2×2 coupler 130.

Figure 2:
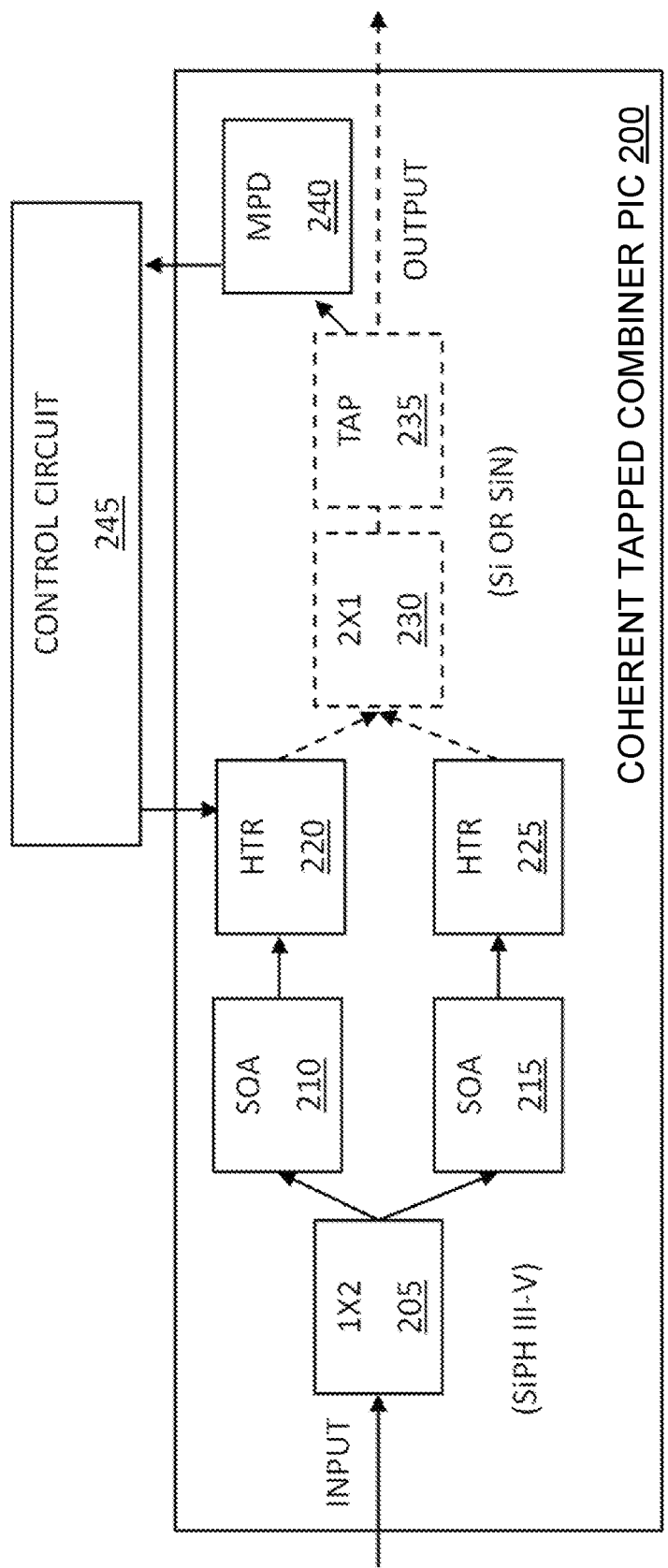
FIG. 2 shows an example low-loss single-die coherent combiner photonic integrated circuit, in accordance with some example embodiments.

FIG. 2 shows an example low-loss single-die coherent combiner PIC 200 in which the heater is set to maximize the monitor photodiode photocurrent, in accordance with some example embodiments. In the example of FIG. 2, an input optical beam is coupled into a 1×2 coupler 205, which splits the beam into a first beam that is coupled to a semiconductor optical amplifier 210 and a second beam that is coupled via a waveguide to a semiconductor optical amplifier 215. In some example embodiments, the light is coupled to one or more passive silicon material waveguides (shown as arrows) that are formed with the coupled-together components on a single-die for low-loss optical performance. Further, the first heater 220 heats the material (e.g., waveguide) guiding the first light beam to perform phase shifting of the first beam. In some example embodiments, a second heater 225 heats the material guiding the second light beam for phase shifting on the lower arm. In some example embodiments, only one of the heaters 220, 225 is implemented (e.g., whichever heater is determined to be more power efficient) thereby lowering overall power consumption of the PIC 200. In some example embodiments, the first and second beams are then combined by a 2×1 coupler 230, which inputs the combined beam into a tap 235 (e.g., via waveguides). The tap 235 siphons off a portion of the optical beam and directs the portion towards a monitor photodiode 240 for analysis by the control circuit 245 to adjust one or more of the heaters 220 and 225. The non-tapped portion of the light is then output from the PIC 200 as illustrated in FIG. 2. In some example embodiments, the non-tapped portion of the light is input into additional PIC components for additional optical processing (e.g., filtering, modulation).

In contrast to the embodiment FIG. 1 in which the maximum power output is indicated by minimizing the current detected at MPD 140, in FIG. 2 the monitor photodiode 240 is able to directly measure the actual output from the coherent combiner (e.g., the 2×1 coupler 230), which efficiently reduces failure points and simplifies use of phase shifting in coherently combining the light.

Figure 3:
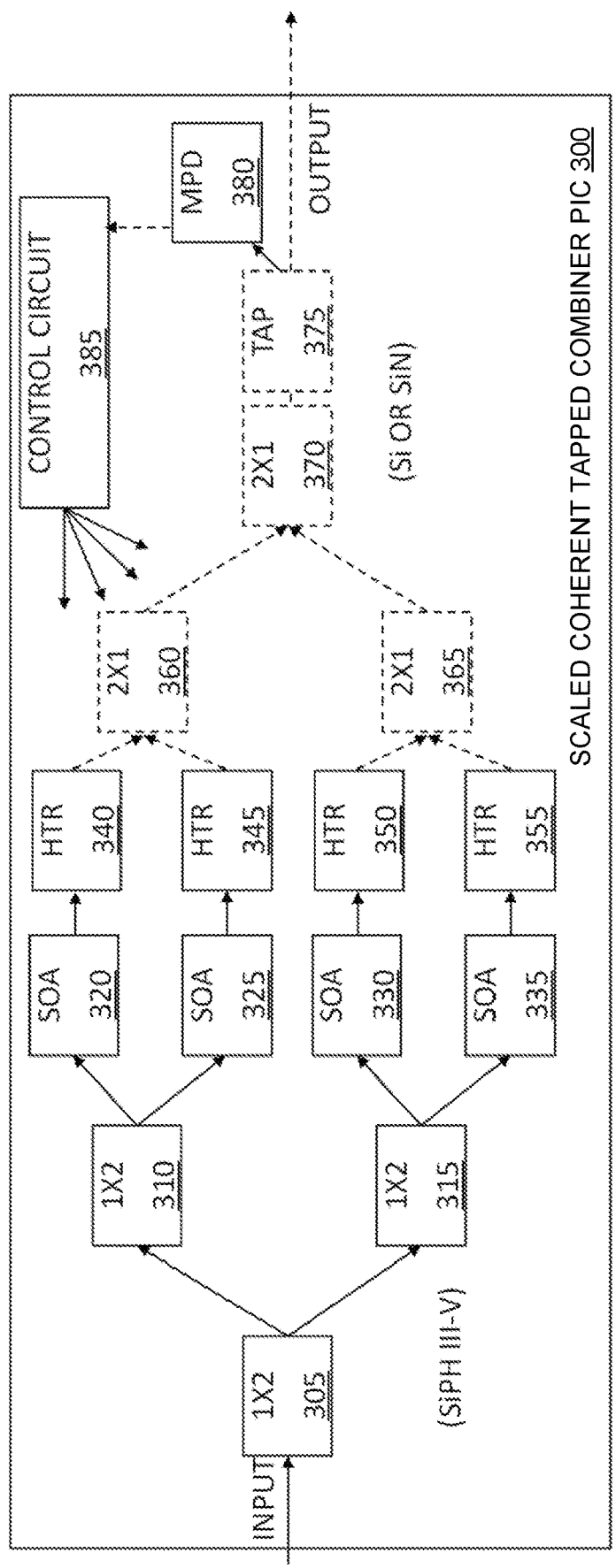
FIG. 3 shows a low-loss single-die scaled coherent tapped combiner photonic integrated circuit, in accordance with some example embodiments.

FIG. 3 shows a low-loss single-the scaled coherent tapped combiner PIC 300, in accordance with some example embodiments. As discussed above, the SOA coherent combiner is scalable, and can operate beyond the maximum power achievable by a single SOA solution. For example, whereas it is difficult or not possible for conventional approaches to add additional SOAs for coherent combination (e.g., achieve four or more SOAs for coherent combination) due to the algorithmic unstableness of coherency once the quantity of SOAs is higher than three, the example embodiments of the SOA combiner can efficiently add and manage SOAs for higher optical power; specifically, and in accordance with some example embodiments, by adding pairs of SOAs and implementing a photodetector (e.g., MPD) as a light coherence indicator for all the light split and combined via integrated splitters and combiners. The architecture implemented in FIG. 1 and FIG. 2, which perform feedback detection of light coherence based on a MPD reading, can consistently be scaled to achieve a higher quantity of SOAs (e.g., four or more SOAs) and optical power using the coherent feedback detection MPD processes. In some example embodiments, the optical loss for the phase tuners (e.g., heaters), combiners (e.g., 2×1 MMI couplers), and topical tap are configured to be less than 3 dB to make the output optical power higher than any given single SOA-based solution.

In the example of FIG. 3, an input optical beam is input into a 1×2 coupler 305 which splits the beam into a first beam that is input (e.g., via waveguide) to a 1×2 coupler 310, and a second beam that is input into a 1×2 coupler 315. The 1×2 coupler 310 splits the first beam into further beams which are input into a semiconductor optical amplifier (SOA) 320 and a semiconductor optical amplifier (SOA) 325, which amplify the beams. The phase between the optical beams is then adjusted using the heater 340 or the heater 345. In some example embodiments, both heaters 340, 345 each individually change the phase of the first and second beams so that they coherently combine according to the MPD current (e.g., minimization, maximization). In some example embodiments, one of the heaters 340, 345 (e.g., whichever is tested or otherwise determined to be more power efficient) changes the phase of its corresponding beam such that the phases of the first and second beams coherently combined according to MPD current.

The beams are then coupled into a combiner, such as a 2×1 coupler 360 (e.g., MMI, Y-junction) for coherent combining with the second beam components generated from the coupler 305. In particular, and in accordance with some example embodiments, the second beam that is split by the 1×2 coupler 315 is amplified using a semiconductor optical amplifier (SOA) 330 and a semiconductor optical amplifier (SOA) 335. The second beam is then phase shifted using one or more of the heaters (e.g., heater 350, heater 355) via heat, and then the second beam's sub-beams are optically combined using a combiner such as the 2×1 coupler 365. After combination in the 2×1 coupler 365, the second beam is then input into the combiner 2×1 coupler 370 for combining with the first beam. The combined light beam is tapped using the tap 375. The portion that is tapped is transduced to current via a monitor photodiode 380 for use by the control circuit 385. The control circuit 385 implements control instructions and logic to control one of the heaters 350, 355 to phase adjust the second beam (e.g., or one of the second-beam components, such as only phase shifting using the heater 350) to cause phase alignment between the first beam and the second beam in a feedback loop. For example, by maximizing the current detected at monitor photodiode 380. It is appreciated that although the scaled example of FIG. 3 implements a tap 375 to a monitor photodiode 380 to maximize current, in some example embodiments a scaled combiner PIC can implement four or more semiconductor optical amplifiers using a minimization of the current as discussed with reference to FIG. 1 above. Further, although for brevity, only two pairs of SOAs are illustrated in the example of FIG. 3, it is appreciated that that additional pairs of SOAs can similarly be coherently combined using the same approach. For example, three pairs of SOAs: coherently aligning and combining the first pair while the second and third pair of SOAs incoherently combined, then coherently aligning and combining the second pair of SOAs based on the first pair while allowing the third pair to decoherently combine, and then coherently combining the third pair of SOAs according to the coherent first and second SOA pairs, where the same MPD is implemented for light coherence detection and adjustment.

Figure 4:
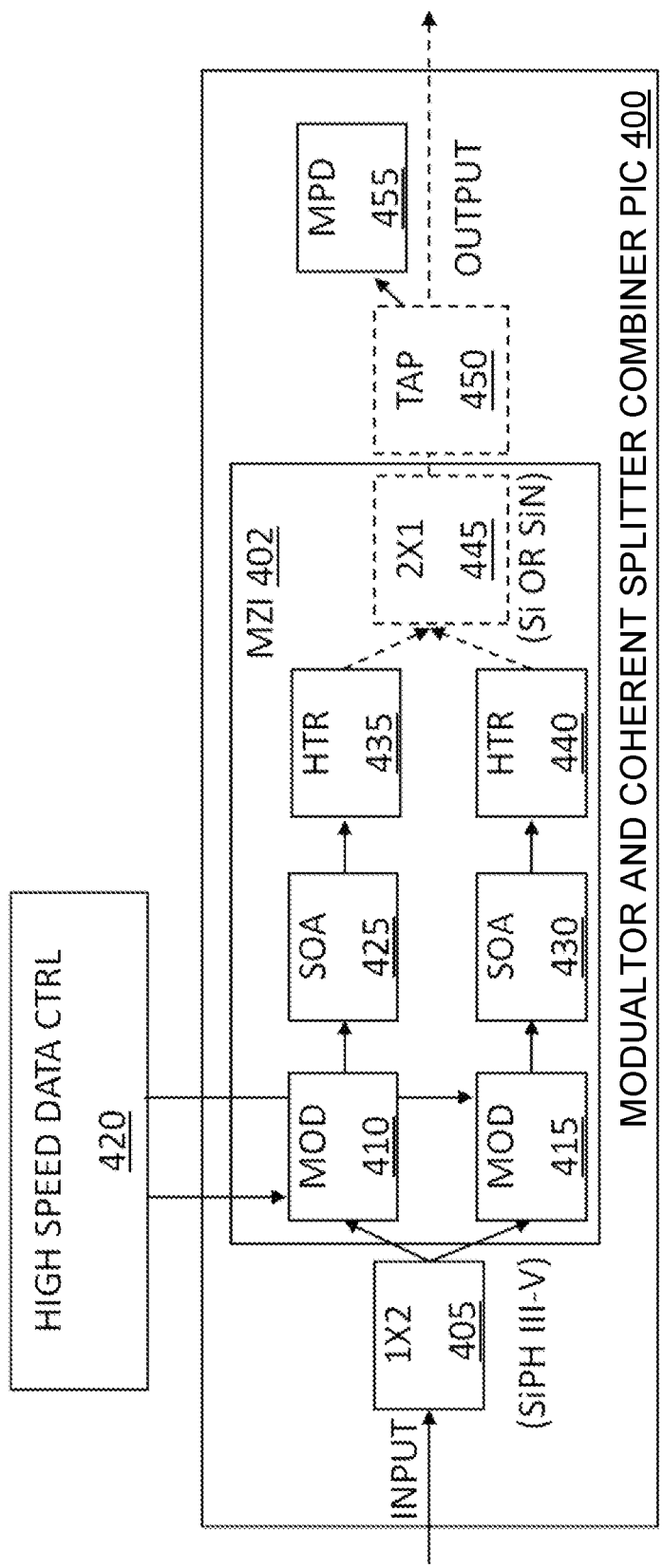
FIG. 4 shows a low-loss single-die modulator combiner photonic integrated circuit, in accordance with some example embodiments.

FIG. 4 shows a low loss-single-die modulator and coherent combiner PIC 400, in accordance with some example embodiments. In the illustrated example, the PIC 400 can perform high-speed modulation and coherent combining, which can be implemented for different high data speed and high optical power PIC designs, in accordance with some example embodiments. In the PIC 400, the architecture comprises a high-speed Mach-Zehnder Interferometer (MZI) modulator 402 that is controlled via a high-speed data controller 420 that performs data modulation using modulator 410 and modulator 415 (e.g., electroabsorption modulator (EAM)). As illustrated, an input beam is input into the 1×2 coupler 405, which splits the beam into a first beam for the top arm of the MZI 402 and a second beam for processing in the bottom arm of the MZI 402. In the top arm, the first beam is modulated using the modulator 410, amplified using the semiconductor amplifier 425, and phase adjusted for coherent combination (e.g., via MPD 455 feedback control) using the heater 435. In the bottom arm, the second beam is modulated using the modulator 415, amplified using the semiconductor optical amplifier 430, and phase adjusted using the heater 440. The modulated and amplified beams are combined using a combiner, such as 2×1 coupler 445, and tapped using the tap 450. Light coherence is detected and adjusted using the current reading from the MPD 455, as discussed above. Further, although in the example of FIG. 4 the architecture is configured to perform coherent combination via maximizing the current from MPD 455 in a control loop before high-speed data is applied, it is appreciated that the architecture could likewise be implemented using the minimization architecture discussed in FIG. 1 above. In some example embodiments, for high-speed data modulation the bias can be set at quadrature to maximize the eye height (e.g., PAM-4 eye height) and eye quality rather than the optical power output, therefore the control target for the MPD current can be half-way between maximum and minimum.

Figure 5:
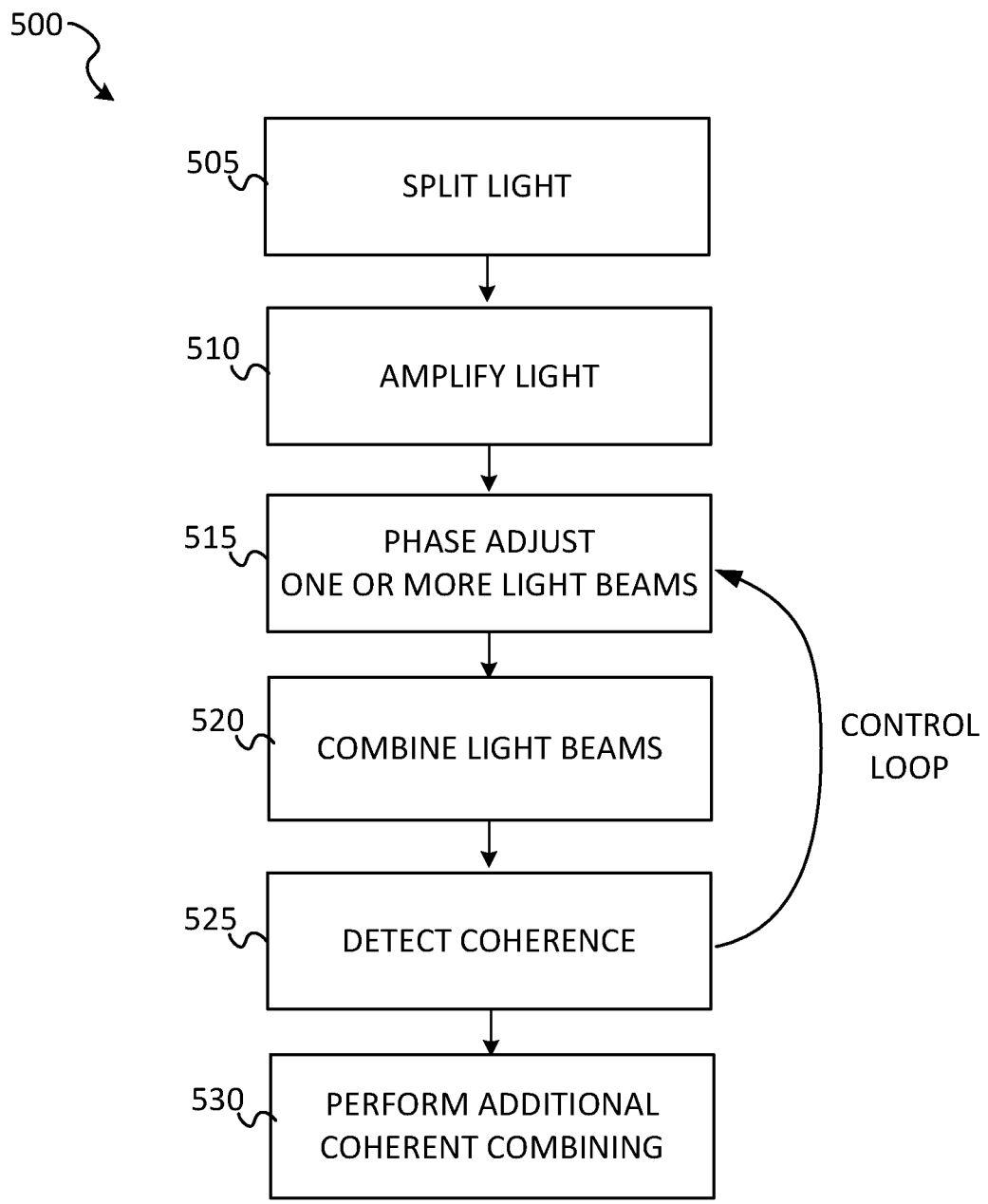
FIG. 5 shows a flow diagram of a method for implementing coherent combining of amplified light in a photonic integrated circuit, in accordance with some example embodiments.

FIG. 5 shows a flow diagram of a method 500 for implementing coherent combining of amplified light in a photonic integrated circuit, in accordance with some example embodiments. At operation 505, a light beam is split into one or more beams. For example, at operation 505, a 1×2 coupler splits a received light beam into a first beam and a second beam. At operation 510, the light is amplified. For example, a first semiconductor optical amplifier amplifies the first beam, and a second semiconductor optical amplifier amplifies a second beam. At operation 515, one or more phase shifters (e.g., heaters) perform phase shifting on the one or more amplified beams such that the beams will be coherently combined downstream in the PIC design (e.g., by a 1×2 coupler). In example embodiments, the phase adjustments are performed to maximize or minimize current detected by a monitor photodiode. At operation 520, the light beams are combined using an optical combiner, such as a 1×2 coupler (e.g., MMI). In some example embodiments, upon the PIC first being initialized, the light is initially incoherently combined at operation 520 to obtain a current reading for coherent detection and correction, wherein the combination of the light is performed coherently after a control loop is established. At operation 525, the optical coherence of the beams is detected via generation of a current from a photodiode. As discussed above, the current from the MPD is implemented in a MPD-based coherent combining control loop, wherein control circuitry (e.g., electrical control circuit in the PIC, an external control circuit) uses the current value of the MPD to perform phase adjustment to and coherence correction to achieve higher optical power. At operation 530, the light is coherently combined using an optical combiner.

At operation 530, additional coherent combining is performed using the operations 505 to 525 on additional SOA pairs. For example, the operations 505-525 can be implemented to perform coherent combination of a first pair of SOAs 320 and 325 to ensure coherent combination at coupler 360 (via maximization/minimization detected from the MPD 380), and at operation 530 one or more additional pairs of SOAs are adjusted via the operations 505-525. For example, in particular, after the first pair of SOAs 320 and 325 are adjusted, the second pair of SOAs 330 and 335 are adjusted to perform coherent combination at the 2×1 coupler 365 and further coherent combination at the final combiner, the 2×1 coupler 205.

Figure 6:
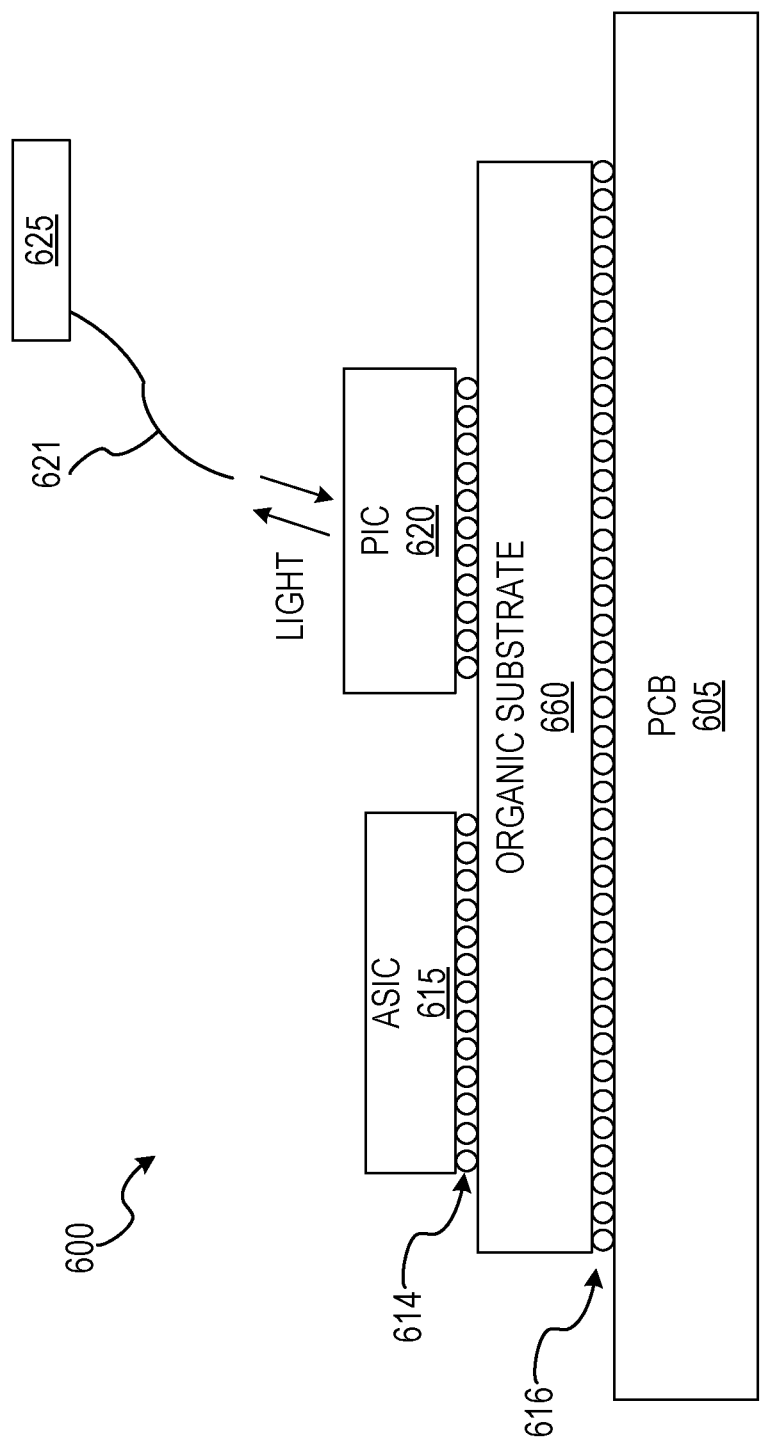
FIG. 6 shows a side view of an optical-electrical device including one or more optical devices, according to some example embodiments.

FIG. 6 shows a side view of an optical-electrical device 600 including one or more optical devices, according to some example embodiments. In illustrated embodiment, the optical-electrical device 600 is shown to include a printed circuit board (PCB) substrate 605, organic substrate 660, an application-specific integrated circuit 615 (ASIC), and PIC 620.

In some example embodiments, the PIC 620 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic (MO) material, or crystal substrate material. III-V semiconductors have elements that are found in group III and group V of the periodic table (e.g., Indium Gallium Arsenide Phosphide (InGaAsP), Gallium Indium Arsenide Nitride (GaInAsN), Aluminum Indium Gallium Arsenide (AlInGaAs)). The carrier dispersion effects of III-V-based materials may be significantly higher than in silicon-based materials, as electron speed in III-V semiconductors is much faster than that in silicon. In addition, III-V materials have a direct bandgap, which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low-loss heterogeneous optical waveguide transitions between the devices' heterogeneous and silicon-only waveguides.

MO materials allow heterogeneous PICs to operate based on the MO effect. Such devices may utilize the Faraday effect, in which the magnetic field associated with an electrical signal modulates an optical beam, offering high-bandwidth modulation, and rotates the electric field of the optical mode, enabling optical isolators. Said MO materials may comprise, for example, materials such as iron, cobalt, or yttrium iron garnet (YIG). Further, in some example embodiments, crystal substrate materials provide heterogeneous PICs with a high electro-mechanical coupling, linear electro-optic coefficient, low transmission loss, and stable physical and chemical properties. Said crystal substrate materials may comprise, for example, lithium niobate (LiNbO3) or lithium tantalate (LiTaO3).

In the example illustrated, the PIC 620 exchanges light with an external light source 625 via an optical fiber 621, in a flip-chip configuration where a top-side of the PIC 620 is connected to the organic substrate 660 and light propagates out (or in) from a bottom-side of the PIC 620 facing away (e.g., towards a coupler), according to some example embodiments. The optical fiber 621 can couple with the PIC 620 using a prism, grating, or lens, according to some example embodiments. The optical components of PIC 620 (e.g., optical modulators, optical switches) are controlled, at least in part, by control circuitry included in ASIC 615. Both ASIC 615 and PIC 620 are shown to be disposed on copper pillars 614, which are used for communicatively coupling the PIC 620 via organic substrate 660. PCB substrate 605 is coupled to organic substrate 660 via ball grid array (BGA) interconnect 616 and may be used to interconnect the organic substrate 660 (and thus, ASIC 615 and PIC 620) to other components of the optical-electrical device 600 not shown (e.g., interconnection modules, power supplies, etc.).

In view of the disclosure above, various examples are set forth below. It should be noted that one or more features of an example, taken in isolation or combination, should be considered within the disclosure of this application.

Example 1. A method comprising: receiving a beam at an optical splitter in a photonic integrated circuit; splitting the beam into a first beam and a second beam using the optical splitter; amplifying the first beam and the second beam using a pair of semiconductor optical amplifiers in the photonic integrated circuit; phase shifting the first beam using a phase shifter in the photonic integrated circuit; combining the first beam and the second beam using an optical combiner to form a combined beam; detecting an optical coherence of the combined beam using a photodetector that measures a current of the combined beam; aligning, using control circuitry, phases of the first beam and the second beam by adjusting the phase shifting of the first beam using the phase shifter, the phase shifter being adjusted by the control circuitry based on a current generated by the photodetector from detecting the combined beam, the aligning causing optically coherent combined light to be output from the optical combiner that combines the first beam and the second beam; and propagating the optically coherent combined light on an output waveguide integrated in the photonic integrated circuit.

Example 2. The method of example 1, further comprising: identifying, by the control circuitry, the current from the photodetector.

Example 3. The method of example 1 or 2, further comprising: maximizing, by the control circuitry, a level of the current from the photodetector by controlling the phase shifter to phase shift the first beam to maximize the current generated from the photodetector to increase optical coherence between the first beam and the second beam upon being combined in the optical combiner.

Example 4. The method of any of examples 1-3, wherein the optical combiner comprises a coupler comprising a first output port and a second output port, wherein the photodetector is coupled to the first output port and the second output port is coupled to the output waveguide.

Example 5. The method of any of examples 1-4, further comprising: minimizing, by the control circuitry, a level of current from the photodetector by controlling the phase shifter to phase shift the first beam to minimize the current generated from the photodetector, wherein minimizing the current from the photodetector increases optical coherence and optical power of light at the second output port.

Example 6. The method of any of examples 1-5, wherein the pair of semiconductor optical amplifiers is a first pair of semiconductor optical amplifiers and the photonic integrated circuit comprises a plurality of pairs of semiconductor optical amplifiers that are coherently combined using the optical combiner, the photodetector, and the control circuitry.

Example 7. The method of any of examples 1-6, wherein the first pair of semiconductor optical amplifiers comprises a first optical amplifier and a second optical amplifier, and the plurality of pairs of semiconductor optical amplifiers comprises a second pair of semiconductor optical amplifiers, the second pair comprising a third optical amplifier and a fourth optical amplifier.

Example 8. The method of any of examples 1-7, wherein the pairs of semiconductor optical amplifiers are coherently combined sequentially by pairs to form the optically coherent combined light.

Example 9. The method of any of examples 1-8, wherein the first pair of semiconductor optical amplifiers are coherently combined by maximizing the current from the photodetector by phase shifting light from the first pair, while light in the second pair of semiconductor optical amplifiers is not adjusted and is decoherently combined, at the optical combiner, with the coherently combined light of the first pair.

Example 10. The method of any of examples 1-8, wherein the second pair of semiconductor optical amplifiers is coherently combined after the light from the first pair of semiconductor optical amplifiers is coherently combined.

Example 11. The method of any of examples 1-10, wherein light from the second pair of semiconductor optical amplifiers is coherently combined by maximizing the current from the photodetector by phase shifting light from the second pair, the phase shifting of the light from the second pair implemented by another phase shifter integrated in the photonic integrated circuit.

Example 12. The method of any of examples 1-11, wherein additional pairs of semiconductor optical amplifiers are integrated in the photonic integrated circuit to generate higher power coherent outputs, wherein all light from each additional pair is split using the optical splitter and is optically amplified and coherently combined based on a current value of the photodetector that indicates all light coherence in the photonic integrated circuit.

Example 13. The method of any of examples 1-12, wherein the photodetector comprises a monitor photodiode.

Example 14. The method of any of examples 1-13, wherein the phase shifter comprises a heater that heats an integrated waveguide that guides the first beam in the photonic integrated circuit.

Example 15. The method of any of examples 1-14, wherein the pair of semiconductor optical amplifiers comprises a first semiconductor optical amplifier that amplifies the first beam and a second semiconductor optical amplifier that amplifies the second beam.

Example 16. A photonic integrated circuit comprising: an optical beam splitter to receive and split a beam of light into a first beam and a second beam; a pair of semiconductor optical amplifiers to amplify the first beam and the second beam; a phase shifter to phase shift the first beam; an optical combiner to combine the first beam and the second beam to form a combined beam; a photodetector to measure current of the combined beam; control circuitry configured to align the phases of the first beam and the second beam by adjusting the phase shifting of the first beam using the phase shifter, the phase shifter being adjusted by the control circuitry based on a current generated by the photodetector from detecting the combined beam, the aligning causing optically coherent combined light to be output from the optical combiner that combines the first beam and the second beam; and an output waveguide to propagate the optically coherent combined light.

Example 17. The photonic integrated circuit of any of the example 16, wherein the control circuitry is further configured to identify the current from the photodetector.

Example 18. The photonic integrated circuit of any of the example 16 or 17, wherein the control circuitry is further configured to maximize a level of the current from the photodetector by controlling the phase shifter to phase shift the first beam to maximize the current generated from the photodetector to increase optical coherence between the first beam and the second beam upon being combined in the optical combiner.

Example 19. The photonic integrated circuit of any of the examples 16-18, wherein the optical combiner comprises a coupler comprising a first output port and a second output port, wherein the photodetector is coupled to the first output port and the second output port is coupled to the output waveguide.

Example 20. The photonic integrated circuit of any of the examples 16-19, wherein the control circuitry is further configured to minimize a level of current from the photodetector by controlling the phase shifter to phase shift the first beam to minimize the current generated from the photodetector, wherein minimizing the current from the photodetector increases optical coherence and optical power of light at the second output port.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method comprising:
receiving a beam at an optical splitter in a photonic integrated circuit;
splitting the beam into a first beam and a second beam using the optical splitter;
amplifying the first beam and the second beam using a pair of semiconductor optical amplifiers in the photonic integrated circuit to result in an amplified first beam and an amplified second beam;
phase shifting the amplified first beam using a phase shifter in the photonic integrated circuit;
combining the amplified first beam and the amplified second beam using an optical combiner to form a combined beam;
detecting an optical coherence of the combined beam using a photodetector that measures a current of the combined beam;
aligning, using control circuitry, phases of the first beam and the second beam by adjusting the phase shifting of the first beam using the phase shifter, the phase shifter being adjusted by the control circuitry based on a current generated by the photodetector from detecting the combined beam, the aligning causing optically coherent combined light to be output from the optical combiner that combines the first beam and the second beam; and
propagating the optically coherent combined light on an output waveguide integrated in the photonic integrated circuit.

2. The method of claim 1, further comprising:
identifying, by the control circuitry, the current from the photodetector.

3. The method of claim 2, further comprising:
maximizing, by the control circuitry, a level of the current from the photodetector by controlling the phase shifter to phase shift the amplified first beam to maximize the current generated from the photodetector to increase optical coherence between the amplified first beam and the amplified second beam upon being combined in the optical combiner.

4. The method of claim 3, wherein the optical combiner comprises a coupler comprising a first output port and a second output port, wherein the photodetector is coupled to the first output port and the second output port is coupled to the output waveguide.

5. The method of claim 4, further comprising:
minimizing, by the control circuitry, a level of current from the photodetector by controlling the phase shifter to phase shift the amplified first beam to minimize the current generated from the photodetector, wherein minimizing the current from the photodetector increases optical coherence and optical power of light at the second output port.

6. The method of claim 1, wherein the pair of semiconductor optical amplifiers is a first pair of semiconductor optical amplifiers and the photonic integrated circuit comprises a plurality of pairs of semiconductor optical amplifiers that are coherently combined using the optical combiner, the photodetector, and the control circuitry.

7. The method of claim 6, wherein the first pair of semiconductor optical amplifiers comprises a first optical amplifier and a second optical amplifier, and the plurality of pairs of semiconductor optical amplifiers comprises a second pair of semiconductor optical amplifiers, the second pair comprising a third optical amplifier and a fourth optical amplifier.

8. The method of claim 7, wherein the pairs of semiconductor optical amplifiers are coherently combined sequentially by pairs to form the optically coherent combined light.

9. The method of claim 8, wherein the first pair of semiconductor optical amplifiers are coherently combined by maximizing the current from the photodetector by phase shifting light from the first pair, while light in the second pair of semiconductor optical amplifiers is not adjusted and is decoherently combined, at the optical combiner, with the coherently combined light of the first pair.

10. The method of claim 9, wherein the second pair of semiconductor optical amplifiers is coherently combined after the light from the first pair of semiconductor optical amplifiers is coherently combined.

11. The method of claim 9, wherein light from the second pair of semiconductor optical amplifiers is coherently combined by maximizing the current from the photodetector by phase shifting light from the second pair, the phase shifting of the light from the second pair implemented by another phase shifter integrated in the photonic integrated circuit.

12. The method of claim 10, wherein additional pairs of semiconductor optical amplifiers are integrated in the photonic integrated circuit to generate higher power coherent outputs, wherein all light from each additional pair is split using the optical splitter and is optically amplified and coherently combined based on a current value of the photodetector that indicates all light coherence in the photonic integrated circuit.

13. The method of claim 1, wherein the photodetector comprises a monitor photodiode.

14. The method of claim 1, wherein the phase shifter comprises a heater that heats an integrated waveguide that guides the amplified first beam in the photonic integrated circuit.

15. The method of claim 1, wherein the photonic integrated circuit comprises a Mach-Zehnder Interferometer (MZI) modulator including a first optical modulator to modulate the first beam and a second optical modulator to modulate the second beam.

16. A photonic integrated circuit comprising:
an optical beam splitter to receive and split a beam of light into a first beam and a second beam;
a pair of semiconductor optical amplifiers to amplify the first beam and the second beam, resulting in an amplified first beam and an amplified second beam;
a phase shifter to phase shift the amplified first beam;
an optical combiner to combine the amplified first beam and the amplified second beam to form a combined beam;
a photodetector to measure current of the combined beam;
control circuitry configured to align the phases of the first beam and the second beam by adjusting the phase shifting of the first beam using the phase shifter, the phase shifter being adjusted by the control circuitry based on a current generated by the photodetector from detecting the combined beam, the aligning causing optically coherent combined light to be output from the optical combiner that combines the first beam and the second beam; and
an output waveguide to propagate the optically coherent combined light.

17. The photonic integrated circuit of claim 16, wherein the photonic integrated circuit comprises a Mach-Zehnder Interferometer (MZI) modulator including a first optical modulator to modulate the first beam and a second optical modulator to modulate the second beam.

18. The photonic integrated circuit of claim 16, wherein the control circuitry is further configured to maximize a level of the current from the photodetector by controlling the phase shifter to phase shift the amplified first beam to maximize the current generated from the photodetector to increase optical coherence between the amplified first beam and the amplified second beam upon being combined in the optical combiner.

19. The photonic integrated circuit of claim 16, wherein the optical combiner comprises a coupler comprising a first output port and a second output port, wherein the photodetector is coupled to the first output port and the second output port is coupled to the output waveguide.

20. The photonic integrated circuit of claim 16, wherein one or more of the first beam or the second beam are coupled from one or more silicon waveguides in the photonic integrated circuit to one or more silicon nitride waveguides, the one or more silicon waveguides coupling light for the semiconductor optical amplifier and the phase shifter, the one or more silicon nitride waveguides implemented to propagate the combined light.

* * * * *